United States Patent [19]
Pham et al.

[11] Patent Number: 5,442,228
[45] Date of Patent: Aug. 15, 1995

[54] MONOLITHIC SHIELDED INTEGRATED CIRCUIT

[75] Inventors: Phuc C. Pham; Charles B. Siragusa, both of Chandler; John C. Veto, Gilbert, all of Ariz.

[73] Assignee: Motorola, Inc., Schaumburg, Ill.

[21] Appl. No.: 214,997

[22] Filed: Mar. 21, 1994

Related U.S. Application Data

[63] Continuation of Ser. No. 864,458, Apr. 6, 1992, abandoned.

[51] Int. Cl.$^6$ ............................................. H01L 23/02
[52] U.S. Cl. .................................... 257/659; 257/676; 257/787; 437/195; 437/229; 437/938
[58] Field of Search ............... 257/676, 664, 787, 659, 257/921; 437/189, 195, 229, 938

[56] References Cited

U.S. PATENT DOCUMENTS

| | | | |
|---|---|---|---|
| 4,965,654 | 10/1990 | Karner et al. | 257/676 |
| 5,019,893 | 5/1991 | Frank et al. | 257/676 |
| 5,075,758 | 12/1991 | Aizawa | 257/676 |
| 5,089,878 | 2/1992 | Lee | 257/664 |
| 5,151,769 | 9/1992 | Immorlica, Jr. et al. | 257/659 |

*Primary Examiner*—William Mintel
*Assistant Examiner*—Roy Potter
*Attorney, Agent, or Firm*—Gary W. Hoshizaki

[57] ABSTRACT

A monolithic shielded integrated circuit is formed using a leadframe (11) having electrically isolated flag areas (12 and 13). Semiconductor die are attached to the electrically isolated flag areas (12 and 13). An integral shield is formed on monolithic integrated circuit (23) for protection against radio frequency noise. A molded package (22) is formed around portions of the leadframe (11) thereby encapsulating the integrated circuit (23) and its integral shield.

15 Claims, 2 Drawing Sheets

MONOLITHIC SHIELDED INTEGRATED CIRCUIT

This application is a continuation of prior application Ser. No. 07/864,458, filed Apr. 6, 1992, now abandoned.

BACKGROUND OF THE INVENTION

This invention relates, in general, to multiple integrated circuits in a single package, and more particularly, to leadframe packages containing more than one high frequency component.

Circuits which are fabricated using many discrete elements are still con,on. A voltage controlled oscillator (VCO) is one such circuit. Some of the components needed to build the VCO cannot be fabricated on existing semiconductor process flows. Thus the VCO must be built using several components.

Many discrete versions of voltage controlled oscillators are being sold for general applications. The VCO's are built from components which are coupled together on one or more printed circuit boards. VCO's are sensitive to radio frequency (RF) noise so the printed circuit boards are placed in a metal cannister for RF noise isolation with terminals exposed for mounting on a printed circuit board. The physical size of the entire VCO can be quite large. How much board space a component takes can be quite critical with todays trends towards increased functionality and miniaturization. Also, a VCO's ability to handle shock and environmental changes may be critical to an application.

Building a discrete version of a VCO involves the purchase of separate components and maintaining an inventory to fabricate circuits. Fabrication of a discrete version will result in yield losses which can be attributed to faulty individual components, printed circuit board errors, assembly errors, and package fabrication errors. The discrete VCO can be expensive to manufacture. Performance may also be a factor which might not be attained using discrete components. It would be of great benefit to provide a VCO in a single integrated circuit package using a minimum number of components which reduces costs, simplifies fabrication, is smaller in size, is resistant to vibration affects, yields well due to higher integration levels, and is shielded from radio frequency noise.

SUMMARY OF THE INVENTION

Briefly stated, this invention is a multiple component system in a leadframe package. The leadframe has a plurality of electrically isolated areas. Components such as integrated circuits, capacitors, resistors, or inductors are bonded to an electrically isolated area. Interconnect is used to couple component terminals, leadframe leads, and electrically isolated areas to predetermined areas. Components sensitive to radio frequency noise are shielded by metal. A molded package is formed around the leadframe to protect the components and interconnect from an external environment. Leadframe leads extend outside the molded package for coupling to other circuitry.

DETAILED DESCRIPTION OF THE DRAWINGS

Figure 1:
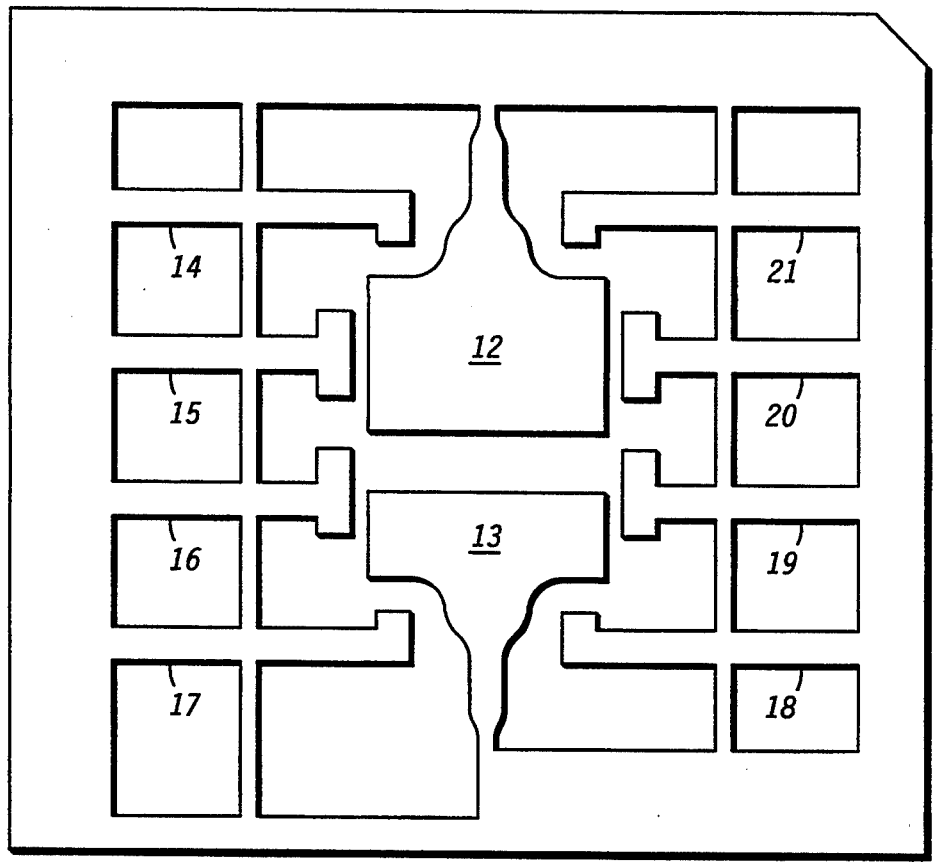
FIG. 1 is an illustration of a leadframe which has two electrically isolated areas in accordance with the present invention.

FIG. 1 is an illustration of a leadframe 11 used in a small outline integrated circuit (SOIC) dual isolated package. Leadframe 11 is made of metal and is formed having a first isolated flag area 12 and a second isolated flag area 13. A plurality of leadframe leads 14–21 are used to couple contact pads from electronic components mounted on first and second isolated flag areas 12 and 13 to circuitry external to the SOIC package. First and second isolated flag areas 12 and 13 are electrically isolated from leadframe leads 14–21. First and second isolated flag areas 12 and 13 are thermally and electrically conductive thereby forming a heat sink and an additional area for contacting a semiconductor terminal.

Leadframe 11 is formed having leadframe leads 14–21 and first and second isolated flag areas 12 and 13 shorted together for handling and manufacturing purposes. Shorting metal areas are removed after an enclosure is molded around portions of leadframe 11. Once metal areas are removed, isolated flag areas 12 and 13 are electrically isolated from each other as well as leadframe leads 14–21. Areas of leadframe leads 14–21 extend past the molded enclosure for coupling to other circuitry.

Figure 2:
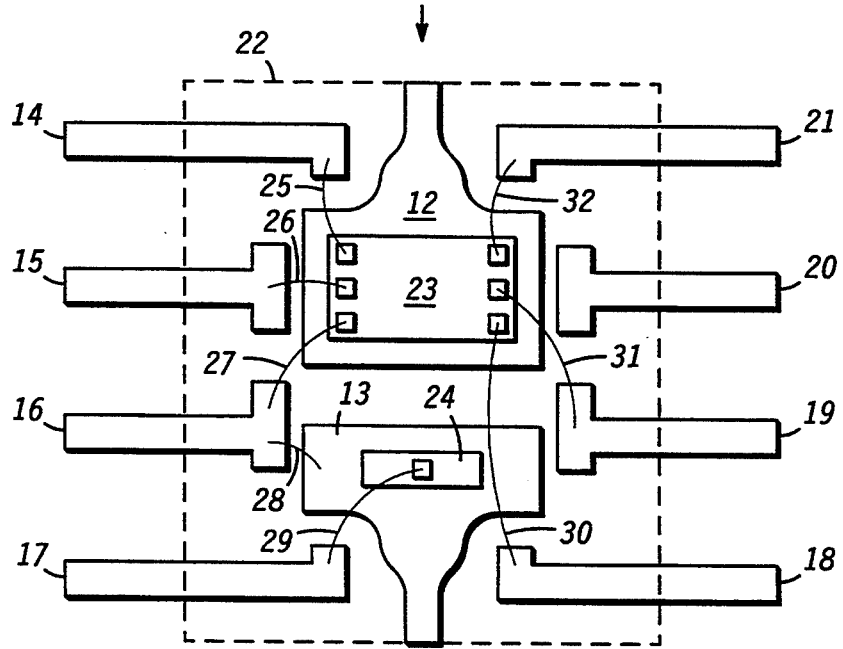
FIG. 2 is an illustration of two semiconductor die in the lead frame of FIG. 1.

FIG. 2 is an illustration of a SOIC package. Metal areas shorting leadframe 11 of FIG. 1 have been removed. In the preferred embodiment, a monolithic shielded integrated circuit voltage controlled oscillator (VCO) 23 is attached to first isolated flag area 12. VCO 23 has six contact pads which couple to external circuitry through leads of leadframe 11. A first VCO terminal couples to leadframe lead 14 through a wirebond 25, a second VCO terminal couples to leadframe lead 15 through a wirebond 26, a third VCO terminal couples to leadframe lead 16 through a wirebond 27, a fourth VCO terminal couples to leadframe lead 18 through a wirebond 30, a fifth VCO terminal couples to leadframe lead 19 through a wirebond 31, and a sixth VCO terminal couples to leadframe lead 21 through a wirebond 32. Monolithic integrated circuit VCO 23 has a substrate which is physically, electrically, and thermally coupled to first isolated flag area 12 through a conductive die attach material. VCO 23 has an integral shield which minimizes radio frequency interference.

A varactor diode 24 is needed for tuning VCO 23. Varactor diodes commonly purchased have two terminals. Each terminal is on opposing sides of the varactor diode. A second terminal of varactor diode 24 is attached to isolated flag area 13. Second terminal of varactor diode 24 is physically, electrically, and thermally coupled to second isolated flag area 13 through the conductive die attach material. Second isolated flag area 13 is used as a terminal for varactor diode 24. Second isolated flag area 13 is coupled to lead 16 through a wirebond 28. A first terminal of varactor diode 24 is coupled to leadframe lead 17 through a wirebond 29. In an alternate embodiment, first or second isolated flag areas 12 and 13 could be used as a terminal which couples to a terminal of another semiconductor die through a wirebond. Electrically isolating a flag area allows it to be used as an additional terminal without utilizing a leadframe lead. Standard leadframes having isolated areas are formed connected to leadframe leads, this limits flexibility of the standard leadframe and forces the use of leadframe leads which could otherwise be used for signal lines.

A molded enclosure 22 (indicated by dotted line) is formed around a portion of the leadframe. In the preferred embodiment, molded enclosure 22 is injection molded. Metal areas of leadframe 11 which are removed, are located outside molded enclosure 22 which simplifies removal after injection molding. Leadframe leads 14–21 extend outside molded enclosure 22 for coupling to other circuitry. Molded enclosure 22 protects VCO 23 and varactor diode 24 from the external environment. Manufacturing a discrete version of a VCO assembly which is well protected from the external environment can be complicated and costly, whereas forming a SOIC leadframe package is very simple and can be manufactured inexpensively. Molded enclosure 22 also forms a rigid structure around wire bonds, leadframe leads, isolated flag areas, and semiconductor components increasing it's ability to withstand shock much better than a discrete version. The discrete VCO assembly is many times larger than the SOIC package VCO assembly which is a tremendous advantage for hand-held receivers/transmitters.

Figure 3:
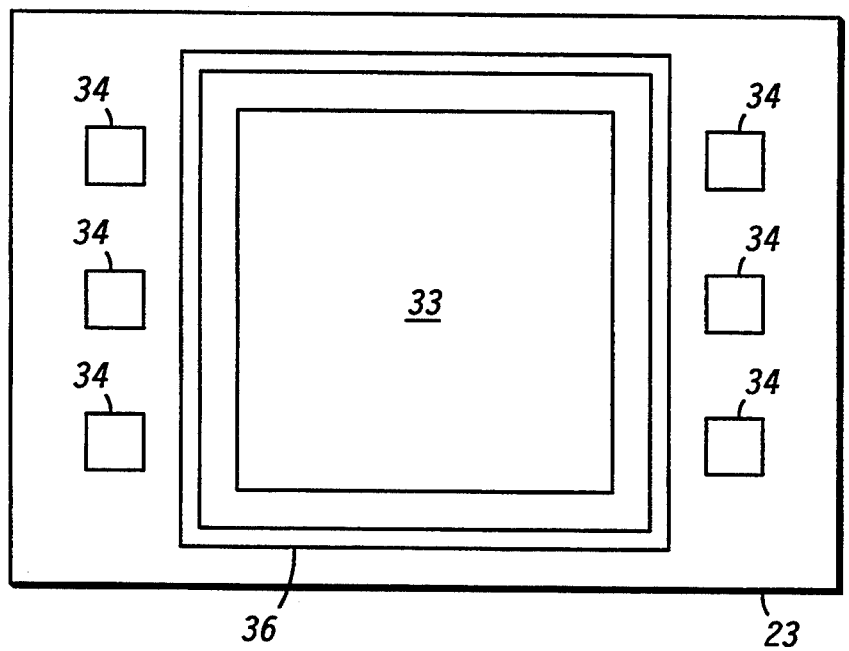
FIG. 3 is a top view of a semiconductor die of FIG. 2 illustrating a substrate contact ring.

FIG. 3 is an illustration of monolithic shielded integrated circuit VCO 23. VCO 23 has a plurality of contact pads 34 for coupling signals to leadframe leads through wirebonds.

Voltage controlled oscillator circuits must meet specific performance standards to be used in a high performance system. Radio frequency noise can affect performance of a voltage controlled oscillator. It is essential to shield the voltage controlled oscillator from radio frequency noise to insure frequency stability. In the preferred embodiment, a radio frequency shield is formed which is integral to monolithic shielded integrated circuit VCO 23 eliminating a need for a cumbersome, bulky, and costly metal-shield formed in or around a SOIC package.

Noise sensitive circuitry of VCO 23 is placed in active area 33. A substrate contact ring 36 forms a ring around active area 33 to contact a substrate in which VCO 23 is formed. In the preferred embodiment, substrate contact ring 36 is an implant in the substrate of VCO 23.

Figure 4:
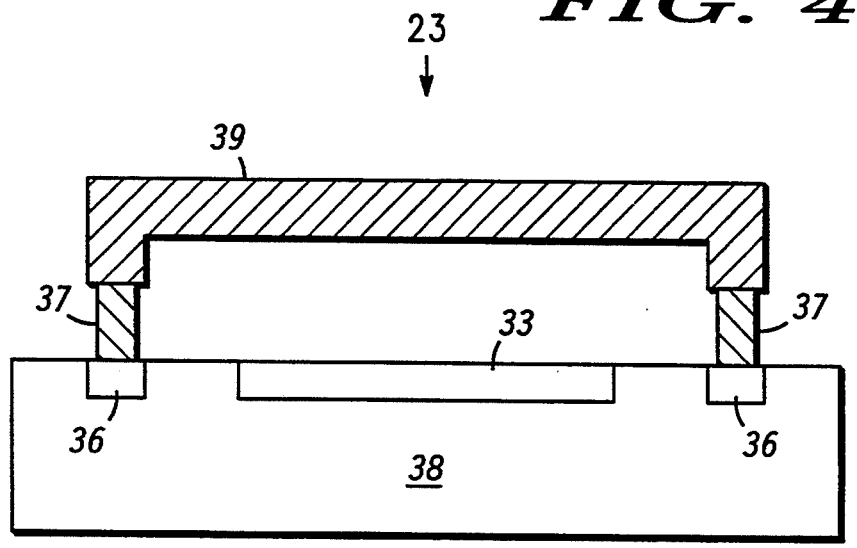
FIG. 4 is a cross-sectional view of the semiconductor die of FIG. 3 illustrating a radio frequency shield.

FIG. 4 is a partial cross-sectional view of VCO 23 which illustrates a metal shield formed around noise sensitive circuitry of VCO 23.

Noise sensitive circuitry of VCO 23 is formed in active area 33. Substrate contact ring 36 forms a ring around active area 33 contacting a substrate 38. A first metal ring 37 is formed which corresponds to the substrate contact ring 36 and forms a wall around active area 33. First metal ring 37 connects to substrate contact ring 36. In the preferred embodiment, first metal ring 37 is formed in a predetermined number of sections. Each section is spaced from an adjacent section forming a gap. The gap is used to route signal or power interconnect lines from the noise sensitive circuitry formed in active area 33 to contact pads external to substrate contact ring 36 and first metal ring 37. A top shield 39 is formed to completely enclose noise sensitive circuitry. Top shield 39 covers active area 33 (noise sensitive circuitry) and extends to couple to each section of first metal ring 37. Substrate contact ring 36, first metal ring 37 and top shield 39 form an enclosure around noise sensitive circuitry and are coupled to ground which allows radio frequency noise an alternate path away from the noise sensitive circuitry. One of the plurality of contact pads 34 is a ground pad which couples to a system ground, substrate contact ring 36, first metal ring 37, and top shield 39 should connect to the ground pad to minimize radio frequency noise from coupling to noise sensitive circuitry.

In the preferred embodiment, first metal ring 37 is formed from a first layer of metal and top shield 39 is formed from a second or subsequent layer of metal. All noise sensitive circuitry formed in active area 33 must use only the first layer of metal for interconnect. Using second layer of metal for interconnect would form a short circuit to top shield 39. The first and second layers are isolated from each other by a dielectric material which covers substrate 38. A via is formed where dielectric material is removed to allow the second layer of metal to contact the first layer of metal.

Multiple layers of metal may be needed to interconnect noise sensitive circuitry in active area 33. In this case a shield can still be formed protecting noise sensitive circuitry from radio frequency noise. A top shield must be formed using an outermost layer of metal. The outermost layer of metal cannot be used for interconnect for noise sensitive circuitry. Multiple metal rings are formed, each ring stacks upon the other forming a vertical wall of metal until the top shield can couple to the vertical wall. Each metal ring corresponds to a substrate contact which is formed around the noise sensitive circuitry. Each metal ring can be sectioned to allow interconnect to pass through for coupling to areas external to the stacked metal rings.

By now it should be appreciated that there has been provided a monolithic shielded integrated circuit. A leadframe having multiple isolated flag areas reduces pin requirements, increases design flexibility, and allows multiple components to be housed in a single package. When compared to discrete assemblys the monolithic shielded integrated circuit is smaller, shock resistant, simplifies manufacturing, and can be produced at a lower cost. An integral shield formed in a monolithic semiconductor eliminates the need for providing package shielding.

We claim:

1. A voltage controlled oscillator comprising:
    a monolithic integrated circuit voltage controlled oscillator including a metal shield integrated on said monolithic integrated circuit voltage controlled oscillator for preventing radio frequency interference;
    a varactor diode for adjusting the frequency of the voltage controlled oscillator; and
    a leadframe package including a leadframe having a plurality of leads, a first flag area for mounting said monolithic integrated circuit voltage controlled oscillator and a second flag area for mounting said varactor diode, said first and second flag areas being electrically isolated from each other and said plurality of leads.

2. The voltage controlled oscillator of claim 1 wherein said monolithic integrated circuit voltage controlled oscillator includes:
    a semiconductor substrate having a predetermined area for noise sensitive portions of said monolithic integrated circuit voltage controlled oscillator;
    a substrate contact ring formed in said semiconductor substrate and surrounding said noise sensitive portions of said monolithic integrated circuit voltage controlled oscillator;

a metal ring, wherein said metal ring couples to said substrate contact ring; and a top shield formed from a subsequent layer of metal, said top shield couples to said metal ring and covers said noise sensitive portions of said monolithic integrated circuit voltage controlled oscillator.

3. The voltage controlled oscillator of claim 2 wherein said metal ring is formed from a first layer of interconnect metal.

4. The voltage controlled oscillator of claim 3 wherein a dielectric is used to isolate said first layer of interconnect metal from a second layer of interconnect metal used to form said top shield.

5. The voltage controlled oscillator of claim 4 wherein said metal ring is formed into a plurality of sections, wherein each section is spaced from an adjacent section to form a void where interconnect passes through for coupling to said monolithic integrated circuit voltage control oscillator.

6. The voltage controlled oscillator of claim 2 wherein said substrate contact ring is formed by an implant into said semiconductor substrate.

7. The voltage controlled oscillator of claim 1 wherein said first and second flag areas are electrically and thermally conductive.

8. The voltage controlled oscillator of claim 1 wherein either said first or second flag areas of said leadframe are electrically coupled to a predetermined terminal through a wire bond.

9. The voltage controlled oscillator of claim 1 further including:

a conductive die attach for coupling said monlithic integrated circuit voltage controlled oscillator to said first flag area and coupling said varactor diode to said second flag area, and wherein said conductive die attach is electrically and thermally conductive.

10. A method for forming a shielded leadframe package, the method comprising:

forming a radio frequency shield on a semiconductor die with interconnect metal of said semiconductor die;

mounting said semiconductor die to a flag area of a leadframe; and molding an enclosure around a portion of said leadframe and said semiconductor die.

11. The method as recited in claim 10 wherein said step of mounting said at least one semiconductor die includes attaching said semiconductor die to said flag area with a conductive die attach material, thereby electrically and thermally coupling to said flag area.

12. The method as recited in claim 10 wherein said step of forming a radio frequency shield includes:

forming a substrate contact ring on a substrate of said semiconductor die, said substrate contact ring being formed around circuitry of said semiconductor die;

forming a metal ring for coupling to said substrate contact ring, said metal ring being formed from a first metal interconnect layer of said semiconductor die; and forming a top shield from a second metal interconnect layer, said top shield coupling to said metal ring, said top shield, metal ring and said substrate for shielding said circuitry of said semiconductor die from radio frequency noise.

13. A semiconductor package comprising:

at least one integrated circuit die wherein said at least one integrated circuit die includes a radio frequency shield formed from interconnect metal layers of said at least one integrated circuit die for protecting said at least one integrated circuit die from radio frequency noise;

a leadframe wherein said at least one integrated circuit is mounted on said leadframe; and a molded enclosure being formed around a portion of said leadframe and said at least one integrated circuit die.

14. The semiconductor package of claim 13 wherein said leadframe comprises a plurality of flag areas and a plurality of leads and wherein said plurality of flag areas are electrically isolated from one another and from said plurality of leads.

15. The semiconductor package of claim 13 wherein said molded enclosure is injection molded around a portion of said leadframe and said at least one integrated circuit die and wherein a portion of said plurality of leads extends through said molded enclosure.

* * * * *